United States Patent
Chen et al.

(10) Patent No.: US 10,298,264 B2
(45) Date of Patent: *May 21, 2019

(54) SYSTEMS AND METHODS FOR SOFT DECISION GENERATION IN A SOLID STATE MEMORY SYSTEM

(71) Applicant: SEAGATE TECHNOLOGY LLC, Cupertino, CA (US)

(72) Inventors: Zhengang Chen, San Jose, CA (US); Yunxiang Wu, Cupertino, CA (US); Erich F. Haratsch, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/948,082

(22) Filed: Apr. 9, 2018

(65) Prior Publication Data
US 2018/0226991 A1    Aug. 9, 2018

Related U.S. Application Data

(63) Continuation of application No. 15/055,006, filed on Feb. 26, 2016, now Pat. No. 9,941,901, which is a continuation of application No. 14/108,226, filed on Dec. 16, 2013, now Pat. No. 9,276,609.

(60) Provisional application No. 61/905,185, filed on Nov. 16, 2013.

(51) Int. Cl.
| H03M 13/00 | (2006.01) |
| G06F 11/10 | (2006.01) |
| H03M 13/11 | (2006.01) |
| G11C 29/52 | (2006.01) |

(52) U.S. Cl.
CPC ...... *H03M 13/1111* (2013.01); *G06F 11/1008* (2013.01); *G06F 11/1012* (2013.01); *G06F 11/1072* (2013.01); *G11C 29/52* (2013.01); *H03M 13/1154* (2013.01)

(58) Field of Classification Search
CPC ............ G06F 11/1048; G06F 11/1008; G06F 11/1012; G06F 11/1072; G06F 1/1008; H03M 13/1111; H03M 13/1154; H03M 13/45; H03M 13/3792
See application file for complete search history.

(56) References Cited

U.S. PATENT DOCUMENTS

| 5,204,874 A | 4/1993 | Falconer et al. |
| 5,892,896 A | 4/1999 | Shingo |
| 6,516,425 B1 | 2/2003 | Belhadj et al. |

(Continued)

FOREIGN PATENT DOCUMENTS

| KR | 10/2009-0013394 | 2/2009 | |
| WO | WO-2014085166 A2 * | 6/2014 | .......... G06F 11/1012 |

*Primary Examiner* — Shelly A Chase
(74) *Attorney, Agent, or Firm* — Holland & Hart LLP

(57) ABSTRACT

Systems and method relating generally to solid state memory, and more particularly to systems and methods for generated data from a solid state memory. A data processing system includes a solid state memory device, a soft data generation circuit operable to receive multiple instances of an element of a read data set accessed from the solid state memory device, and access a scramble compensating extended look up table using the multiple instances of the element to receive corresponding soft data, and a data decoder circuit operable to yield a decoded output from the soft data.

20 Claims, 5 Drawing Sheets

(56) References Cited

U.S. PATENT DOCUMENTS

| | | |
|---|---|---|
| 6,651,032 B2 | 11/2003 | Peterson et al. |
| 7,127,549 B2 | 10/2006 | Sinclair |
| 7,254,692 B1 | 8/2007 | Teoh et al. |
| 7,310,699 B2 | 12/2007 | Sinclair |
| 7,317,735 B1 * | 1/2008 | Ojard .................... H04L 1/0046 370/470 |
| 7,523,013 B2 | 4/2009 | Gorobets et al. |
| 7,596,656 B2 | 9/2009 | Elhamias |
| 7,721,146 B2 | 5/2010 | Polisetti et al. |
| 7,778,077 B2 | 8/2010 | Gorobets et al. |
| 8,010,738 B1 | 8/2011 | Chilton et al. |
| 8,151,137 B2 | 4/2012 | McKean et al. |
| 8,174,912 B2 | 5/2012 | Warren |
| 8,176,367 B2 | 5/2012 | Dreifus |
| 8,289,768 B2 | 10/2012 | Warren et al. |
| 8,381,077 B2 | 2/2013 | Warren |
| 8,458,416 B2 | 6/2013 | Warren et al. |
| 8,499,220 B2 | 7/2013 | Warren |
| 8,560,765 B2 | 10/2013 | Warren |
| 8,762,823 B2 | 6/2014 | Yang |
| 9,013,434 B2 | 4/2015 | Hu et al. |
| 9,164,828 B2 | 10/2015 | Xia et al. |
| 9,195,537 B2 | 11/2015 | Sharon et al. |
| 9,201,729 B2 | 12/2015 | Wu et al. |
| 9,235,469 B2 | 1/2016 | Zhang et al. |
| 2002/0091965 A1 | 7/2002 | Moshayedi |
| 2005/0044459 A1 | 2/2005 | Scheuerlein et al. |
| 2005/0104187 A1 | 9/2005 | Lee et al. |
| 2005/0209804 A1 | 9/2005 | Basso et al. |
| 2006/0245248 A1 | 11/2006 | Hu |
| 2007/0266200 A1 | 11/2007 | Gorobets et al. |
| 2008/0010557 A1 | 1/2008 | Kume |
| 2008/0046779 A1 | 2/2008 | Merchang et al. |
| 2008/0086275 A1 | 4/2008 | Astigarraga et al. |
| 2008/0162079 A1 | 7/2008 | Astigarraga et al. |
| 2008/0307270 A1 | 12/2008 | Li |
| 2009/0063895 A1 | 3/2009 | Smith |
| 2009/0067303 A1 | 3/2009 | Poo et al. |
| 2009/0147698 A1 | 6/2009 | Potvin |
| 2009/0172280 A1 | 7/2009 | Trika et al. |
| 2009/0204853 A1 | 8/2009 | Diggs et al. |
| 2009/0282301 A1 | 11/2009 | Flynn et al. |
| 2010/0121609 A1 | 5/2010 | Gorinevsky |
| 2010/0122148 A1 | 5/2010 | Flynn et al. |
| 2010/0306577 A1 | 12/2010 | Dreifus et al. |
| 2010/0306580 A1 | 12/2010 | McKean et al. |
| 2011/0058415 A1 | 3/2011 | Warren |
| 2011/0060862 A1 | 3/2011 | Warren |
| 2011/0060865 A1 | 3/2011 | Warren et al. |
| 2012/0102261 A1 | 4/2012 | Burger et al. |
| 2012/0110376 A1 | 5/2012 | Dreifus et al. |
| 2015/0113205 A1 | 4/2015 | Cai et al. |
| 2015/0117097 A1 | 4/2015 | Cai et al. |

* cited by examiner

SYSTEMS AND METHODS FOR SOFT DECISION GENERATION IN A SOLID STATE MEMORY SYSTEM

CROSS REFERENCE TO RELATED APPLICATIONS

This application is a continuation of U.S. patent application Ser. No. 15/055,006, filed on 26 Feb. 2016, and entitled, SYSTEMS AND METHODS FOR SOFT DECISION GENERATION IN A SOLID STATE MEMORY SYSTEM, now U.S. Pat. No. 9,941,901, issued on Apr. 10, 2018, which is a continuation application of U.S. patent application Ser. No. 14/108,226, filed on 16 Dec. 2013, and entitled, SYSTEMS AND METHODS FOR SOFT DECISION GENERATION IN A SOLID STATE MEMORY SYSTEM, now U.S. Pat. No. 9,276,609, issued on 1 Mar. 2016, which claims the benefit of the filing date of U.S. Provisional Application No. 61/905,185, filed 16 Nov. 2013, and entitled "SYSTEMS AND METHODS FOR SOFT DECISION GENERATION IN A SOLID STATE MEMORY SYSTEM," the disclosures of which are incorporated, in their entireties, by this reference.

FIELD OF THE INVENTION

Systems and method relating generally to solid state memory, and more particularly to systems and methods for generated data from a solid state memory.

BACKGROUND

Data in a solid state storage device decays over time requiring more error correction capability over time. To correct additional errors, enhanced error correction circuitry may be employed. However, such enhanced error correction circuitry increases access latency.

Hence, for at least the aforementioned reasons, there exists a need in the art for advanced systems and methods for maintaining data in a solid state storage device.

SUMMARY

Systems and method relating generally to solid state memory, and more particularly to systems and methods for generated data from a solid state memory.

Various embodiments of the present invention provide data processing systems that include: a solid state memory, a data de-randomizer circuit, a soft data generation circuit, and a data decoder circuit. The data de-randomizer circuit operable to de-randomize a read data set accessed from the solid state memory device. The soft data generation circuit is operable to: receive multiple instances of one or more elements the read data set, where each instance of a respective element is read using a different reference value; and access a scramble compensating extended look up table using the multiple instances of the element to receive corresponding soft data. The data decoder circuit is operable to apply one or more iterations of a data decoding algorithm to the soft data to yield a decoded output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
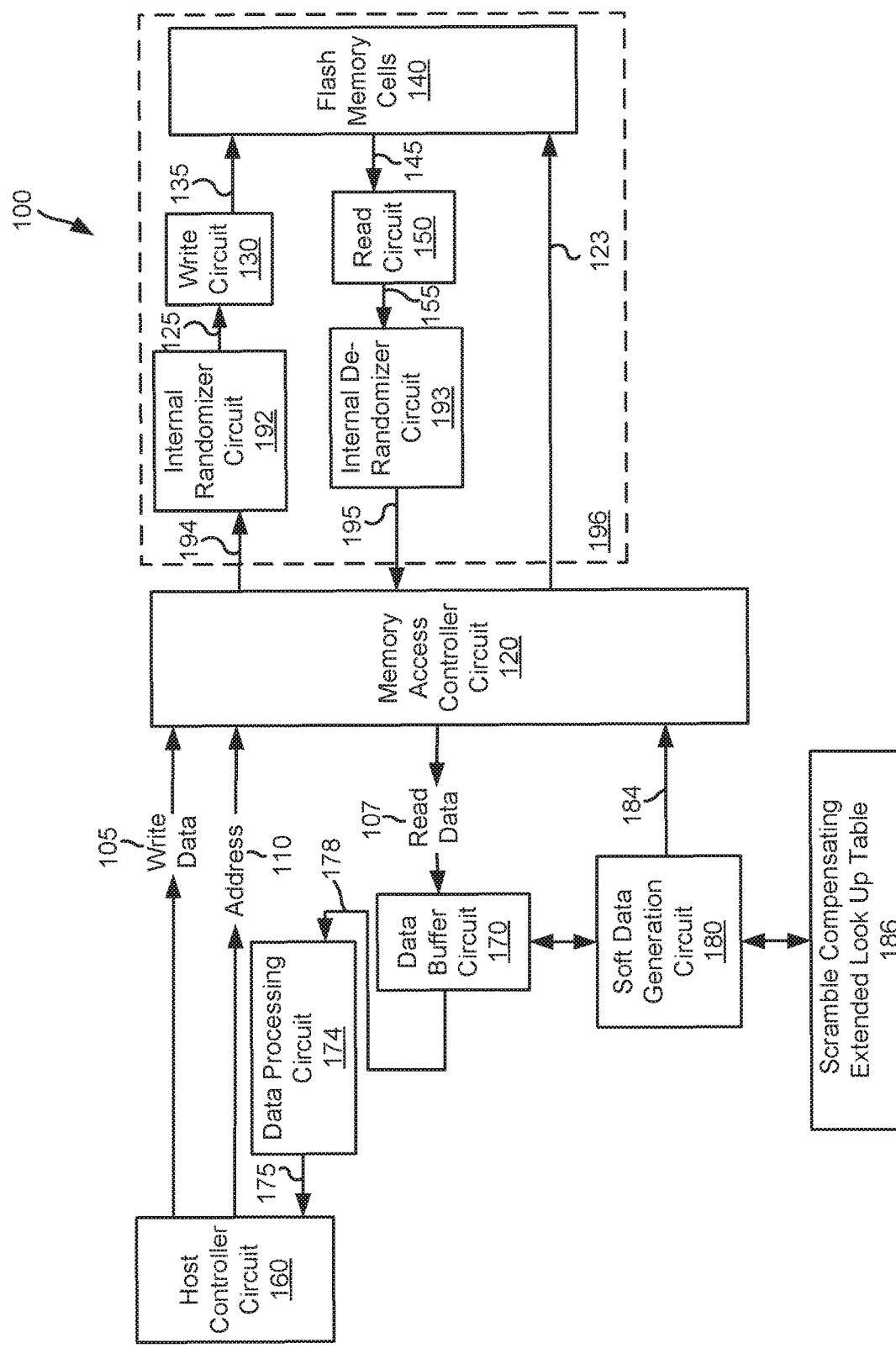
FIG. 1 shows a solid state storage device including a soft data generation circuit relying on a scramble compensating extended look up table operable to compensate for internal randomizing circuitry in accordance with various embodiments of the present invention.

Systems and method relating generally to solid state memory, and more particularly to systems and methods for generated data from a solid state memory.

Various embodiments of the present invention provide data processing systems that include: a solid state memory, a data de-randomizer circuit, a soft data generation circuit, and a data decoder circuit. The data de-randomizer circuit operable to de-randomize a read data set accessed from the solid state memory device. The soft data generation circuit is operable to: receive multiple instances of one or more elements the read data set, where each instance of a respective element is read using a different reference value; and access a scramble compensating extended look up table using the multiple instances of the element to receive corresponding soft data. The data decoder circuit is operable to apply a soft data decoding algorithm to the soft data to yield a decoded output. In some cases, the data decoding algorithm is a low density parity check decoding algorithm.

In various cases, the data processing system is implemented on an integrated circuit. In one or more cases, the solid state memory is a flash memory.

In various instances of the aforementioned embodiments, the solid state memory is a single bit per cell flash memory. In some such instances, the scramble compensating extended look up table includes a number of soft data values corresponding to different possible values for the multiple instances of the one or more elements. A first portion of the soft data values correspond to data unmodified by the de-randomizer circuit, and a second portion of the soft data values correspond to data modified by the de-randomizer circuit.

In other instances of the aforementioned embodiments, the solid state memory is a multi-bit bit per cell flash memory, wherein the multiple instances of one or more elements the read data set include a first set of instances corresponding to a first bit in a cell of the multi-bit bit per cell flash memory, and a second set of instances corresponding to a second bit in the cell of the multi-bit bit per cell flash memory. In some such instances, the scramble compensating extended look up table includes a first set of soft data values corresponding to different possible values for the first set of instances, and a second set of soft data values corresponding to different possible values for the second set of instances. In some cases, the first portion of the first set of soft data values corresponds to data unmodified by the de-randomizer circuit, and a second portion of the first set of soft data values corresponds to data modified by the de-randomizer circuit. The second portion of the soft data values corresponds to either data modified by the de-randomizer circuit, or data unmodified by the de-randomizer circuit.

Other embodiments of the present invention provide methods for recovering data from a solid state memory device. The methods include: repeatedly accessing a cell of a solid state memory device using different reference voltage values yield multiple instances of a read; applying a de-randomizer algorithm using a de-randomizer circuit to each of the multiple instances of the read to yield corresponding de-randomized instances; and accessing a scramble compensating extended look up table using the de-randomized instances to receive corresponding soft data. In some cases, the methods further include applying a low density parity check decoding algorithm to the soft data to yield a decoded output.

In some instances of the aforementioned embodiments, the solid state memory is a single bit per cell flash memory. In some such instances, the scramble compensating extended look up table includes a number of soft data values corresponding to different possible values for the multiple instances of the one or more elements. A first portion of the soft data values correspond to data unmodified by the de-randomizer circuit, and a second portion of the soft data values correspond to data modified by the de-randomizer circuit.

In other instances of the aforementioned embodiments, the solid state memory is a multi-bit per cell flash memory, wherein the multiple instances of one or more elements the read data set include a first set of instances corresponding to a first bit in a cell of the multi-bit bit per cell flash memory, and a second set of instances corresponding to a second bit in the cell of the multi-bit bit per cell flash memory. In some such instances, the scramble compensating extended look up table includes a first set of soft data values corresponding to different possible values for the first set of instances, and a second set of soft data values corresponding to different possible values for the second set of instances. In some cases, the first portion of the first set of soft data values corresponds to data unmodified by the de-randomizer circuit, and a second portion of the first set of soft data values corresponds to data modified by the de-randomizer circuit. The second portion of the soft data values corresponds to either data modified by the de-randomizer circuit, or data unmodified by the de-randomizer circuit.

Turning to FIG. 1, a solid state storage device 100 including a soft data generation circuit 180 relying on a scramble compensating extended look up table 186 operable to compensate for internal randomizing circuitry in accordance with various embodiments of the present invention. Storage device 100 includes a host controller circuit 160 that directs read and write access to a solid state memory device 196. Solid state memory device 196 includes flash memory cells 140 that may be NAND flash memory cells or another type of solid state memory cells as are known in the art. Flash memory cells 140 are accessed via randomization circuitry that includes an internal randomizer circuit 192 and an internal de-randomizer circuit 193. Internal randomizer circuit 192 randomizes write data 194 to yield randomized write data 125 that is provided to a write circuit 130. In turn, write circuit converts randomized write data to a series corresponding write voltages 135 that are stored to flash memory cells at locations indicated by an address 123. A read circuit 150 receives previously stored data as a series of read voltages 145 from locations indicated by address 123, and converts read voltages 145 into corresponding randomized read data 155. Randomized read data 155 is provided to internal de-randomizer circuit 193 that reverses the randomization originally applied by internal randomizer circuit 192 to yield read data 195.

Figure 4:
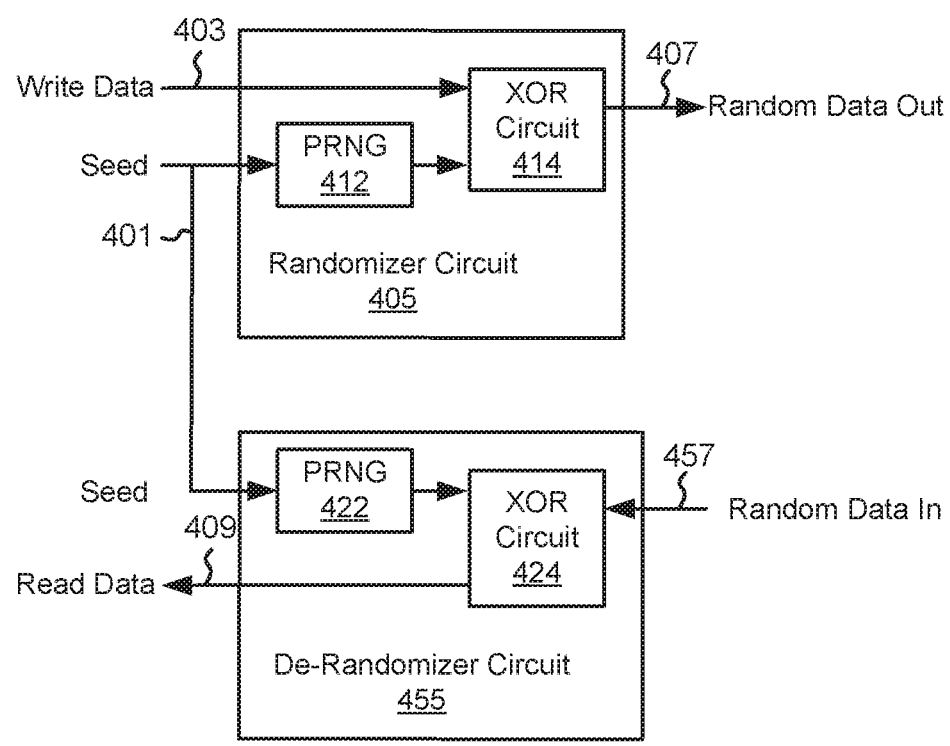
FIG. 4 shows one implementation of a combination of a randomizer and de-randomizer circuit in accordance with various embodiments of the present invention.

Referring to FIG. 4, one implementation of a combination of a randomizer and de-randomizer circuit is shown in accordance with various embodiments of the present invention. The randomizer and de-randomizer circuit includes a randomizer circuit 405 and a de-randomizer circuit 455. Randomizer circuit 405 may be used in place of internal randomizer circuit 192, and de-randomizer circuit 455 may be used in place of internal de-randomizer circuit 193. As shown, randomizer circuit 405 includes a pseudo-random number generator 412 operable to generate a pseudo-random series of inputs to an XOR circuit 414 based upon a seed 401. XOR circuit 414 applies an exclusive OR function to the pseudo-random numbers and the write data 403 to yield random data output 407. As shown, de-randomizer circuit 455 includes a pseudo-random number generator 422 operable to generate a pseudo-random series of inputs to an XOR circuit 424 based upon seed 401. XOR circuit 424 applies an exclusive OR function to the pseudo-random numbers and the read data 457 to yield data output 409.

A data write is effectuated when host controller circuit 160 provides write data 105 to be written along with an address 110 indicating the location to be written. A memory access controller circuit 120 receives write data 105 and address 110. Memory access controller 120 formats write data 105 and provides address 123 and an encoded data set as write data 194 to internal randomizer circuit 192. As discussed above, internal randomizer circuit 192 randomizes the received data to yield write data 125 that is provided to a write circuit 130. Write circuit 130 provides write voltage 135 corresponding to respective groupings of encoded write data 125. For example, where flash memory cells are two bit cells (i.e., depending upon the read voltage, a value of '11', '10', '00', or '01' is returned), encoded write data 125 may be converted to one of four voltages as set forth in the following table:

| Two Bit Data Input | Voltage Output |
|---|---|
| '01' | V3 |
| '00' | V2 |
| '10' | V1 |
| '11' | V0 |

Where V3 is greater than V2, V2 is greater than V1, and V1 is greater than V0.

A data read is effectuated when host controller circuit 160 provides address 110 along with a request to read data from the corresponding location in flash memory cells 140. Memory access controller 120 provides address 123 as the location from which the data is to be read. In turn, flash memory cells 140 provides read voltages 145 from locations indicated by address 123 to read circuit 150 that converts the voltages to a series of randomized read data 155. Using the same two bit example, the following multi-bit read data 155 results:

| Voltage Input | Two Big Data Output |
|---|---|
| >VD | '01' |
| >VC | '00' |
| >VB | '10' |
| <=VA | '11' |

Where VD is greater than VC, VC is greater than VB, and VB is greater than VB. This multi-bit read data 155 is provided from memory access controller 120 as read data 107 to a data buffer circuit 170.

In order to generate soft data for the particular location being read, the location is read multiple times, each time using a different threshold value by read circuit 150 to determine the actual level of read voltage 145 for the location. This results in multiple binary values being stored to data buffer circuit 170 for the particular location in flash memory cells 140. In one particular embodiment of the present invention, each location is read five times, each time using a different threshold value by read circuit 150 to convert the data.

Figure 5:
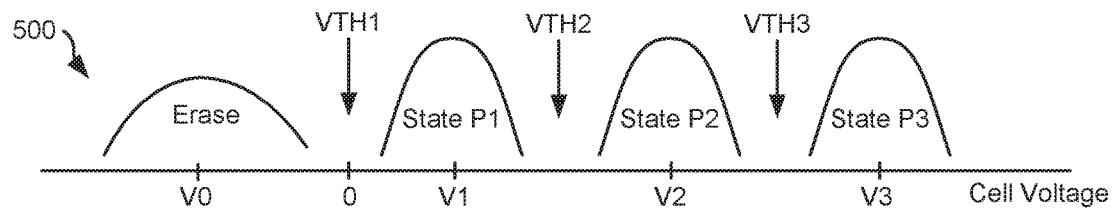
FIG. 5 are voltage diagrams showing the distribution of voltage values for different states in a multi-state P3ell of a solid state memory device.
Figure 5:
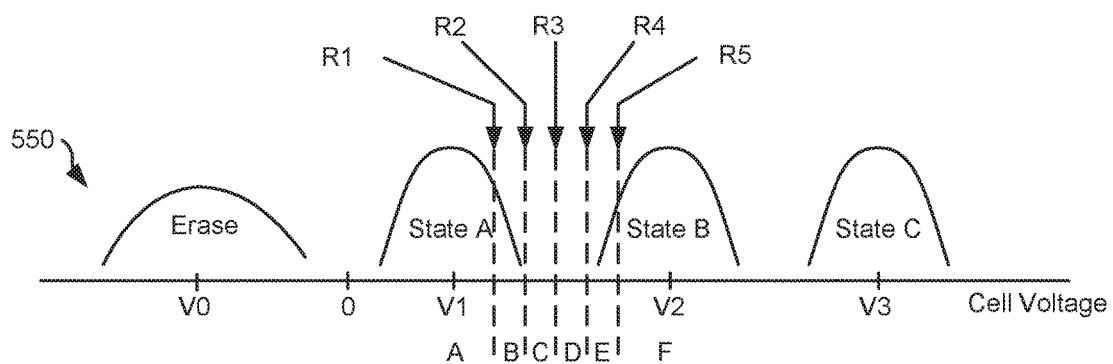
Figure 5:
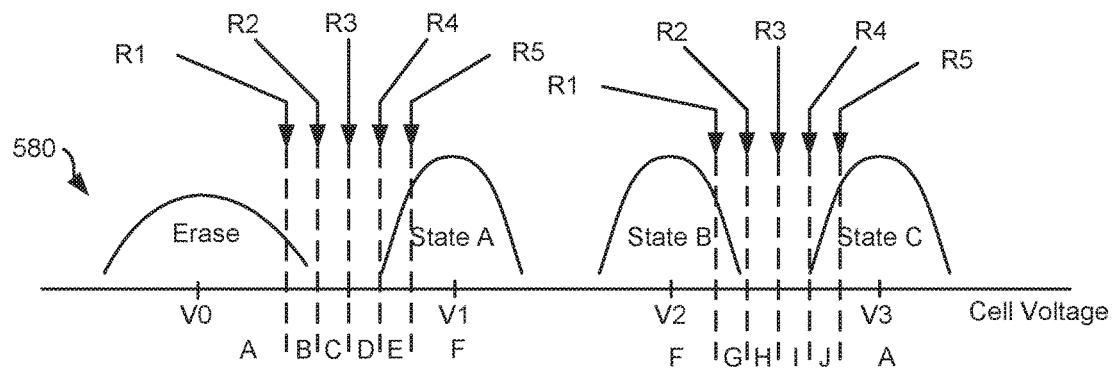

Turning to FIG. 5, an example of this multi-read process is shown. A voltage diagram 500 shows the voltage distributions of a two bit memory cell with each of the voltage distributions representing a different state (i.e., erase, state P1, state P2, state P3). Using the example in the table above, the erase state P3 corresponds to an output value from read circuit 150 of '11', state P1 corresponds to an output value from read circuit 150 of '10', state P2 corresponds to an output value from read circuit 150 of '00', and state P3 corresponds to an output value from read circuit 150 of '01'.

Another voltage diagram 550 shows voltage diagram 500 where multiple threshold values (R1, R2, R3, R4, R5) are used to read the lower page (least significant bit) of the cell. In this case, assume the cell is programmed to be state P1 ('01'), then successively reading the cell while successively changing the reference voltage used by read circuit 150 from R1 to R5 the values read extend from '1' in a region A to a U in region F as shown in the following table:

| R1 | R2 | R3 | R4 | R5 | Represented Region | Soft Data |
|---|---|---|---|---|---|---|
| 1 | 1 | 1 | 1 | 1 | A | LLR_A (7) |
| 0 | 1 | 1 | 1 | 1 | B | LLR_B (4) |
| 0 | 0 | 1 | 1 | 1 | C | LLR_C (2) |
| 0 | 0 | 0 | 1 | 1 | D | LLR_D (−1) |
| 0 | 0 | 0 | 0 | 1 | E | LLR_E (−3) |
| 0 | 0 | 0 | 0 | 0 | F | LLR_F (−6) |

The soft data values (LLR_A, LLR_B, LLR_C, LLR_D, LLR_E, and LLR_F) are used to map the results of the series of reads to soft data.

The aforementioned table assumes that the data written to the location is actually state P1 data. This may not be the case as internal randomizer circuit may have inverted the data. In such a case, the data may be one of the other states. Where the least significant bit was inverted (i.e., from a '1' in the expected state P1 to a '0' in the inverted state), the following reversed table would result from the multiple read:

| R1 | R2 | R3 | R4 | R5 | Represented Region | Soft Data |
|---|---|---|---|---|---|---|
| 0 | 0 | 0 | 0 | 0 | A | ?? |
| 1 | 0 | 0 | 0 | 0 | B | ?? |
| 1 | 1 | 0 | 0 | 0 | C | ?? |
| 1 | 1 | 1 | 0 | 0 | D | ?? |
| 1 | 1 | 1 | 1 | 0 | E | ?? |
| 1 | 1 | 1 | 1 | 1 | F | ?? |

The reversal of the table requires a different approach to assigning soft data values. Of note, where it is not known whether an inversion was applied by internal randomizer circuit 192, the results from reading region A and region F are ambiguous, which is not particularly harmful to the soft decoder because region A and region F are usually assigned saturated LLR values. However, the results from reading region B, region C, region D and region E can be discerned between the inverted and non-inverted condition. Using the lack of ambiguity as to the center regions (i.e., region B, region C, region D and region E) and the known increment from R1 to R5, the ambiguity of region A and region B can be resolved allowing for the assignment of soft data to each of the results possible in an inverted situation. These results are used to extend the table of soft data as follows:

| R1 | R2 | R3 | R4 | R5 | Represented Region | Soft Data |
|---|---|---|---|---|---|---|
| 1 | 1 | 1 | 1 | 1 | A | LLR_A (7) |
| 0 | 1 | 1 | 1 | 1 | B | LLR_B (4) |
| 0 | 0 | 1 | 1 | 1 | C | LLR_C (2) |
| 0 | 0 | 0 | 1 | 1 | D | LLR_D (−1) |
| 0 | 0 | 0 | 0 | 1 | E | LLR_E (−3) |
| 0 | 0 | 0 | 0 | 0 | F | LLR_F (−6) |
| 1 | 0 | 0 | 0 | 0 | B | LLR_B (−4) |
| 1 | 1 | 0 | 0 | 0 | C | LLR_C (−2) |
| 1 | 1 | 1 | 0 | 0 | D | LLR_D (1) |
| 1 | 1 | 1 | 1 | 0 | E | LLR_E (3) |

Of note, the magnitude for the soft data for corresponding regions is maintained because they originate from the same decision region (e.g., LLR_B(4) and LLR_B(−4)). However, the sign of the soft data is flipped (e.g., LLR_B(4) and LLR_B(−4)) because the soft data as the soft data is provided to a data processing circuit 174 that occurs after internal de-randomizer circuit 193 has reversed the prior bit inversion. This extended table is maintained as a map in a scramble compensating extended look up table 186.

Another voltage diagram 580 shows voltage diagram 500 where multiple threshold values (R1, R2, R3, R4, R5) are used to read the upper page (in this example, also most significant bit) of the cell. In this case, assume the cell is programmed to be state P3 ('10'), then successively reading the cell while successively changing the reference voltage used by read circuit 150 from R1 to R5 the values read extend from '1' in a region A to a U in region F as shown in the following table:

| R1 | R2 | R3 | R4 | R5 | Represented Region | Soft Data |
|----|----|----|----|----|--------------------|-----------|
| 1  | 1  | 1  | 1  | 1  | A | LLR_A (7) |
| 0  | 1  | 1  | 1  | 1  | B | LLR_B (4) |
| 0  | 0  | 1  | 1  | 1  | C | LLR_C (2) |
| 0  | 0  | 0  | 1  | 1  | D | LLR_D (−1) |
| 0  | 0  | 0  | 0  | 1  | E | LLR_E (−3) |
| 0  | 0  | 0  | 0  | 0  | F | LLR_F (−6) |
| 1  | 0  | 0  | 0  | 0  | G | LLR_G (−3) |
| 1  | 1  | 0  | 0  | 0  | H | LLR_H (−1) |
| 1  | 1  | 1  | 0  | 0  | I | LLR_I (1) |
| 1  | 1  | 1  | 1  | 0  | J | LLR_J (4) |

The soft data values (LLR_A, LLR_B, LLR_C, LLR_D, LLR_E, LLR_F, LLR_G, LLR_H, LLR_I and LLR_J) are used to map the results of the series of reads to soft data.

In the case of the upper page read, when an unknown randomization is applied by internal randomizer circuit 192, ambiguity can occur between a number of the states A-J, and not just in states A and F as was the case in reading the lower page making it impossible to resolve the ambiguity without knowing whether or not the data was inverted by internal randomizer circuit 192. Because it is not possible to resolve the ambiguity, the table for the upper page (i.e., most significant bit) is not extended. This upper page table is included with the extended lower page table in scramble compensating extended look up table 186.

Referring again to FIG. 1, a soft data generation circuit 180 provides a read control output 184 to memory access controller circuit 120 that causes a repeated read of the location similar to that discussed above in relation to FIG. 5. The binary results of the repeated reads are received as read data 107 and stored to data buffer circuit 170. The series of values for each location are accessed by soft data generation circuit 180 from data buffer circuit 170. The combination of the read inputs accessed from data buffer circuit 170 are used to access scramble compensating extended look up table 186 which returns the corresponding soft data. Soft data generation circuit 180 provides the soft data retrieved from scramble compensating extended look up table 186 that maps to the series of values for each location read from flash memory cells 140 back to data buffer circuit 170.

Figure 3:
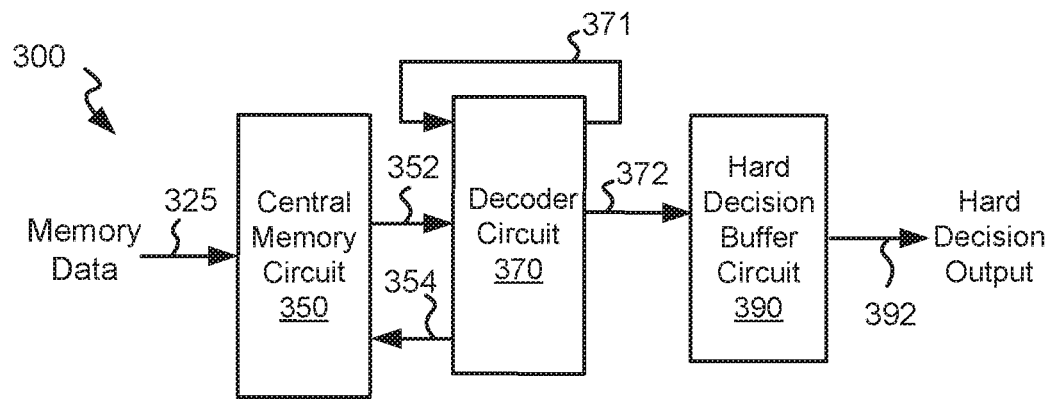
FIG. 3 depicts one implementation of a data processing circuit that may be used in relation to embodiments of the present invention.

A data processing circuit 174 receives soft data 178 from data buffer circuit 170 and applies data processing thereto to correct any errors and yield the originally written data as read data 175 to the requesting host controller circuit 160. Turning to FIG. 3, implementation of a data processing circuit 300 is shown that may be used in place of data processing circuit 174 in some embodiments of the present invention. Where data processing circuit 300 is used in place of data processing circuit 174 of FIG. 1, soft data 178 is connected to a memory data 325 input, and read data 175 is connected to a hard decision output 392.

Data processing circuit 300 receives memory data 325 where it is stored to a central memory circuit 350. Once a decoder circuit 370 is available, a previously stored data set 325 is accessed from central memory circuit 350 as a decoder input 352. In some embodiments of the present invention, the decoder circuit 370 is a low density parity check decoder circuit as is known in the art. Based upon the disclosure provided herein, one of ordinary skill in the art will recognize a variety of decoder circuits that may be used in relation to various embodiments of the present invention. Decoder circuit 370 applies a data decoding algorithm to decoder input 352 to yield a decoded output 371. Where decoded output 371 fails to converge (i.e., decoded output 371 includes errors), another iteration of the data decoding algorithm is applied to decoder input 352 guided by decoded output 371. This process is repeated until either decoded output 371 converges (i.e., is error free) or a timeout condition is met. Alternatively, where decoded output 371 converges, it is provided as a decoded output 372 to a hard decision buffer circuit 390. Hard decision buffer circuit 390 provides the hard decisions of decoded output 372 as a hard decision output 392.

It should be noted that in some cases, solid state storage device 100 includes standard solid state data access circuitry including an error correction decoding circuit (not shown). In such cases, soft data generation circuit 180 and data processing circuit 174 may only operate when the standard data access circuitry fails to yield an error free result. Thus, standard access to flash memory cells 140 may be applied first, and when it fails, the combination of soft data generation circuit 180 and data processing circuit 174 apply soft data based processing in an attempt to recover the data.

Figure 2:
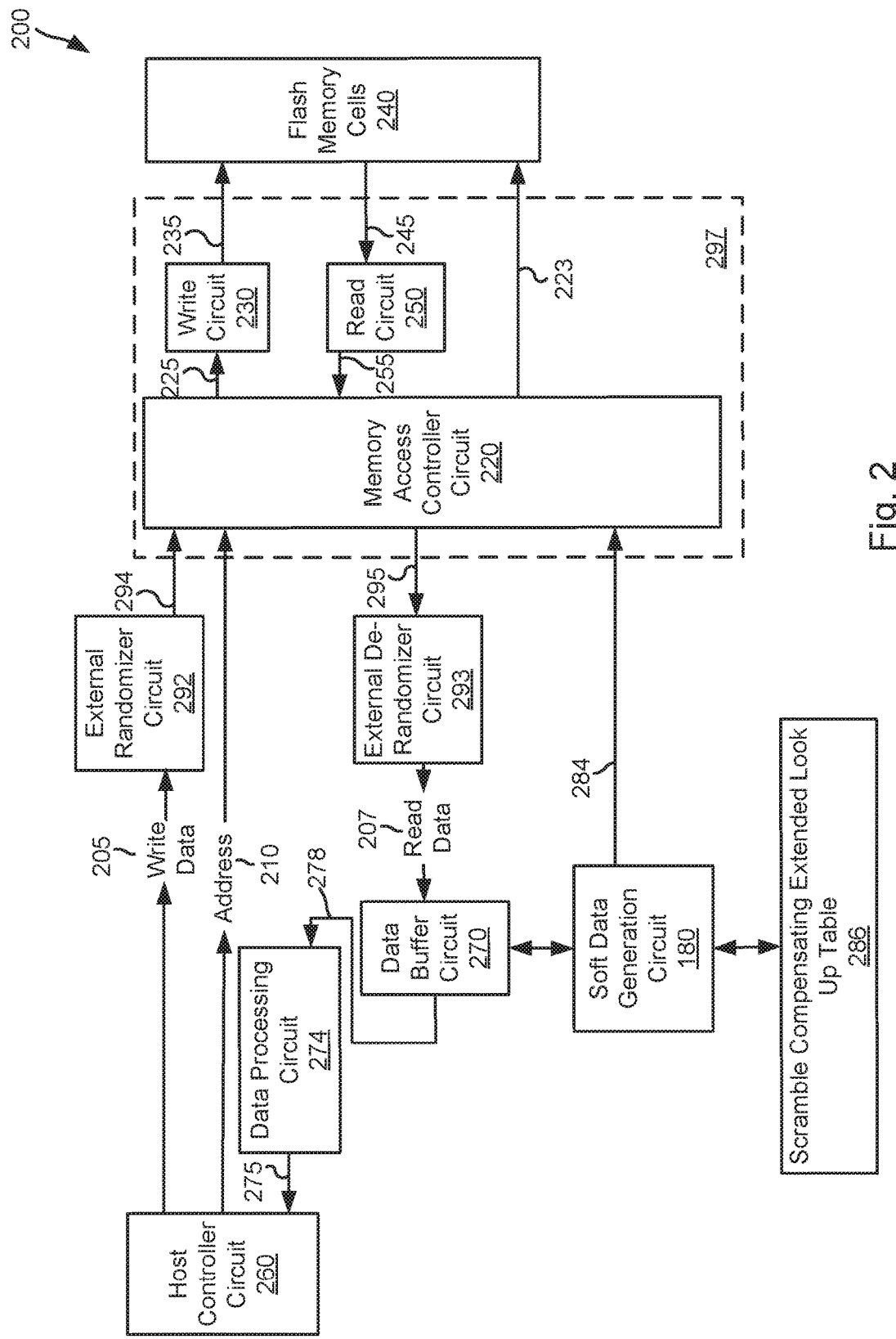
FIG. 2 shows a solid state storage device including a soft data generation circuit relying on a scramble compensating extended look up table operable to compensate for external randomizing circuitry in accordance with various embodiments of the present invention.

Turning to FIG. 2, a solid state storage device 200 including a soft data generation circuit 280 relying on a scramble compensating extended look up table 286 operable to compensate for external randomizing circuitry in accordance with various embodiments of the present invention. Storage device 200 includes a host controller circuit 260 that directs read and write access to a solid state memory device 296. Solid state memory device 296 includes flash memory cells 240 that may be NAND flash memory cells or another type of solid state memory cells as are known in the art. Flash memory cells 240 are accessed via a solid state P1 access circuit 297 that includes a memory access controller circuit 220, a write circuit 230 and a read circuit 250.

Write data 205 is provided from host controller circuit 260 via an external randomizing circuit 292 that yields randomized write data 194 that is provided to memory access controller circuit 220. Read data 207 is provided from memory access controller circuit 220 via an external de-randomizer circuit 293. In particular, external de-randomizer circuit 293 receives randomized read data 295 and reverses the randomization originally applied by external randomizer circuit 292 to yield read data 207.

Referring to FIG. 4, one implementation of a combination of a randomizer and de-randomizer circuit is shown in accordance with various embodiments of the present invention. The randomizer and de-randomizer circuit includes randomizer circuit 405 and de-randomizer circuit 455. Randomizer circuit 405 may be used in place of external randomizer circuit 292, and de-randomizer circuit 455 may be used in place of external de-randomizer circuit 293. As shown, randomizer circuit 405 includes a pseudo-random noise generator 412 operable to generate a pseudo-random series of inputs to an XOR circuit 414 based upon a seed 401. XOR circuit 414 applies an exclusive OR function to the pseudo-random numbers and the write data 403 to yield random data output 407. As shown, de-randomizer circuit 455 includes a pseudo-random number generator 422 operable to generate a pseudo-random series of inputs to an XOR circuit 424 based upon seed 401. XOR circuit 424 applies an exclusive OR function to the pseudo-random numbers and the read data 457 to yield data output 409.

A data write is effectuated when host controller circuit 260 provides write data 205 to be written along with an address 210 indicating the location to be written. External randomizer circuit 292 randomizes the received data and provides randomized write data 294 to memory access controller circuit 220. Memory access controller 220 formats randomized write data 294 and provides an address 223 and an encoded write data 225 to write circuit 230. Write circuit 230 provides a write voltage 235 corresponding to respective groupings of encoded write data 225 that is used to charge respective flash memory cells addressed by address 223. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '01' | V3 |
| '00' | V2 |
| '10' | V1 |
| '11' | V0 |

Where V3 is greater than V2, V2 is greater than V1, and V1 is greater than V0.

A data read is effectuated when host controller circuit 260 provides address 210 along with a request to read data from the corresponding location in flash memory cells 240. Memory access controller 220 accesses a read voltage 245 from locations indicated by address 223 and compares the voltage to a threshold value to reduce the voltage to a multi-bit read data 255. Using the same two bit example, the following multi-bit read data 255 results:

| Voltage Input | Two Big Data Output |
|---|---|
| >VD | '01' |
| >VC | '00' |
| >VB | '10' |
| <=VA | '11' |

This multi-bit read data 255 is provided from memory access controller 220 as randomized read data 295 to external de-randomizer circuit 293. External de-randomizer circuit 293 de-randomizes the received data to yield read data 207. Read data 207 is stored to a data buffer circuit 270.

In order to generate soft data for the particular location being read, the location is read multiple times, each time using a different threshold value by read circuit 250 to determine the actual level of read voltage 245 for the location. This results in multiple binary values being stored to data buffer circuit 270 for the particular location in flash memory cells 240. In one particular embodiment of the present invention, each location is read five times, each time using a different threshold value by read circuit 250 to convert the data.

Turning to FIG. 5, an example of this multi-read process is shown. Voltage diagram 500 shows the voltage distributions of a two bit memory cell with each of the voltage distributions representing a different state (i.e., erase, state P1, state P2, state P3). Using the example in the table above, the erase state P3 corresponds to an output value from read circuit 250 of '11', state P1 corresponds to an output value from read circuit 250 of '10', state P2 corresponds to an output value from read circuit 250 of '00', and state P3 corresponds to an output value from read circuit 250 of '01'.

Another voltage diagram 550 shows voltage diagram 500 where multiple threshold values (VTHA, VTHB, VTHC, VTHD, VTHE) are used to read the lower page (least significant bit) of the cell. In this case, assume the cell is programmed to be state P1 ('01'), then successively reading the cell while successively changing the reference voltage used by read circuit 250 from VTHA to VTHE the values read extend from '1' in a region A to a in region F as shown in the following table:

| VTHA | VTHB | VTHC | VTHD | VTHE | Represented Region | Soft Data |
|---|---|---|---|---|---|---|
| 1 | 1 | 1 | 1 | 1 | A | LLR_A (7) |
| 0 | 1 | 1 | 1 | 1 | B | LLR_B (4) |
| 0 | 0 | 1 | 1 | 1 | C | LLR_C (2) |
| 0 | 0 | 0 | 1 | 1 | D | LLR_D (−1) |
| 0 | 0 | 0 | 0 | 1 | E | LLR_E (−3) |
| 0 | 0 | 0 | 0 | 0 | F | LLR_F (−6) |

The soft data values (LLR_A, LLR_B, LLR_C, LLR_D, LLR_E, and LLR_F) are used to map the results of the series of reads to soft data.

The aforementioned table assumes that the data written to the location is actually state P1 data. This may not be the case as internal randomizer circuit may have inverted the data. In such a case, the data may be one of the other states. Where the least significant bit was inverted (i.e., from a '1' in the expected state P1 to a in the inverted state), the following reversed table would result from the multiple read:

| VTHA | VTHB | VTHC | VTHD | VTHE | Represented Region | Soft Data |
|---|---|---|---|---|---|---|
| 0 | 0 | 0 | 0 | 0 | A | ?? |
| 1 | 0 | 0 | 0 | 0 | B | ?? |
| 1 | 1 | 0 | 0 | 0 | C | ?? |
| 1 | 1 | 1 | 0 | 0 | D | ?? |
| 1 | 1 | 1 | 1 | 0 | E | ?? |
| 1 | 1 | 1 | 1 | 1 | F | ?? |

The reversal of the table requires a different approach to assigning soft data values. Of note, where it is not known whether an inversion was applied by external randomizer circuit 292, the results from reading region A and region F are ambiguous. However, the results from reading region B, region C, region D and region E can be discerned between the inverted and non-inverted condition. Using the lack of ambiguity as to the center regions (i.e., region B, region C, region D and region E) and the known increment from VTHA to VTHE, the ambiguity of region A and region B can be resolved allowing for the assignment of soft data to each of the results possible in an inverted situation. These results are used to extend the table of soft data as follows:

| VTHA | VTHB | VTHC | VTHD | VTHE | Represented Region | Soft Data |
|------|------|------|------|------|--------------------|-----------|
| 1 | 1 | 1 | 1 | 1 | A | LLR_A (7) |
| 0 | 1 | 1 | 1 | 1 | B | LLR_B (4) |
| 0 | 0 | 1 | 1 | 1 | C | LLR_C (2) |
| 0 | 0 | 0 | 1 | 1 | D | LLR_D (−1) |
| 0 | 0 | 0 | 0 | 1 | E | LLR_E (−3) |
| 0 | 0 | 0 | 0 | 0 | F | LLR_F (−6) |
| 1 | 0 | 0 | 0 | 0 | B | LLR_B (−4) |
| 1 | 1 | 0 | 0 | 0 | C | LLR_C (−2) |
| 1 | 1 | 1 | 0 | 0 | D | LLR_D (1) |
| 1 | 1 | 1 | 1 | 0 | E | LLR_E (3) |

Of note, the magnitude for the soft data for corresponding regions is maintained because they originate from the same state (e.g., LLR_B(4) and LLR_B(−4)). However, the sign of the soft data is flipped (e.g., LLR_B(4) and LLR_B(−4)) because the soft data as the soft data is provided to a data processing circuit 274 that occurs after external de-randomizer circuit 293 has reversed the prior bit inversion. This extended table is maintained as a map in a scramble compensating extended look up table 286.

Another voltage diagram 580 shows voltage diagram 500 where multiple threshold values (VTHA, VTHB, VTHC, VTHD, VTHE) are used to read the upper page (most significant bit) of the cell. In this case, assume the cell is programmed to be state P3 (10), then successively reading the cell while successively changing the reference voltage used by read circuit 250 from VTHA to VTHE the values read extend from '1' in a region A to a in region F as shown in the following table:

| VTHA | VTHB | VTHC | VTHD | VTHE | Represented Region | Soft Data |
|------|------|------|------|------|--------------------|-----------|
| 1 | 1 | 1 | 1 | 1 | A | LLR_A (7) |
| 0 | 1 | 1 | 1 | 1 | B | LLR_B (4) |
| 0 | 0 | 1 | 1 | 1 | C | LLR_C (2) |
| 0 | 0 | 0 | 1 | 1 | D | LLR_D (−1) |
| 0 | 0 | 0 | 0 | 1 | E | LLR_E (−3) |
| 0 | 0 | 0 | 0 | 0 | F | LLR_F (−6) |
| 1 | 0 | 0 | 0 | 0 | G | LLR_G (−3) |
| 1 | 1 | 0 | 0 | 0 | H | LLR_H (−1) |
| 1 | 1 | 1 | 0 | 0 | I | LLR_I (1) |
| 1 | 1 | 1 | 1 | 0 | J | LLR_J (4) |

The soft data values (LLR_A, LLR_B, LLR_C, LLR_D, LLR_E, LLR_F, LLR_G, LLR_H, LLR_I and LLR_J) are used to map the results of the series of reads to soft data.

Referring again to FIG. 2, in the case of the upper page read, when an unknown randomization is applied by external randomizer circuit 292, ambiguity can occur between a number of the states A-J, and not just in states A and F as was the case in reading the lower page making it impossible to resolve the ambiguity without knowing whether or not the data was inverted by external randomizer circuit 292. Because it is not possible to resolve the ambiguity, the table for the upper page (i.e., most significant bit) is not extended. This upper page table is included with the extended lower page table in scramble compensating extended look up table 286.

Referring again to FIG. 2, a soft generation circuit 280 provides a read control output 284 to memory access controller circuit 220 that causes a repeated read of the location similar to that discussed above in relation to FIG. 5. The binary results of the repeated reads are received as read data 207 and stored to data buffer circuit 270. The series of values for each location are accessed by soft data generation circuit 280 from data buffer circuit 270. The combination of the read inputs accessed from data buffer circuit 270 are used to access scramble compensating extended look up table 286 which returns the corresponding soft data. Soft data generation circuit 280 provides the soft data retrieved from scramble compensating extended look up table 286 that maps to the series of values for each location read from flash memory cells 240 back to data buffer circuit 270.

A data processing circuit 274 receives soft data 278 from data buffer circuit 270 and applies data processing thereto to correct any errors and yield the originally written data as read data 275 to the requesting host controller circuit 260. Turning to FIG. 3, implementation of a data processing circuit 300 is shown that may be used in place of data processing circuit 274 in some embodiments of the present invention. Where data processing circuit 300 is used in place of data processing circuit 274 of FIG. 1, soft data 278 is connected to a memory data 325 input, and read data 275 is connected to a hard decision output 392.

Data processing circuit 300 receives memory data 325 where it is stored to a central memory circuit 350. Once a decoder circuit 370 is available, a previously stored data set 325 is accessed from central memory circuit 350 as a decoder input 352. In some embodiments of the present invention, the decoder circuit 370 is a low density parity check decoder circuit as is known in the art. Based upon the disclosure provided herein, one of ordinary skill in the art will recognize a variety of decoder circuits that may be used in relation to various embodiments of the present invention. Decoder circuit 370 applies a data decoding algorithm to decoder input 352 to yield a decoded output 371. Where decoded output 371 fails to converge (i.e., decoded output 371 includes errors), another iteration of the data decoding algorithm is applied to decoder input 352 guided by decoded output 371. This process is repeated until either decoded output 371 converges (i.e., is error free) or a timeout condition is met. Alternatively, where decoded output 371 converges, it is provided as a decoded output 372 to a hard decision buffer circuit 390. Hard decision buffer circuit 390 provides the hard decisions of decoded output 372 as a hard decision output 392.

It should be noted that in some cases, solid state storage device 200 includes standard solid state data access circuitry including an error correction decoding circuit (not shown). In such cases, soft data generation circuit 280 and data processing circuit 274 may only operate when the standard data access circuitry fails to yield an error free result. Thus, standard access to flash memory cells 240 may be applied first, and when it fails, the combination of soft data generation circuit 280 and data processing circuit 274 apply soft data based processing in an attempt to recover the data.

Figure 6:
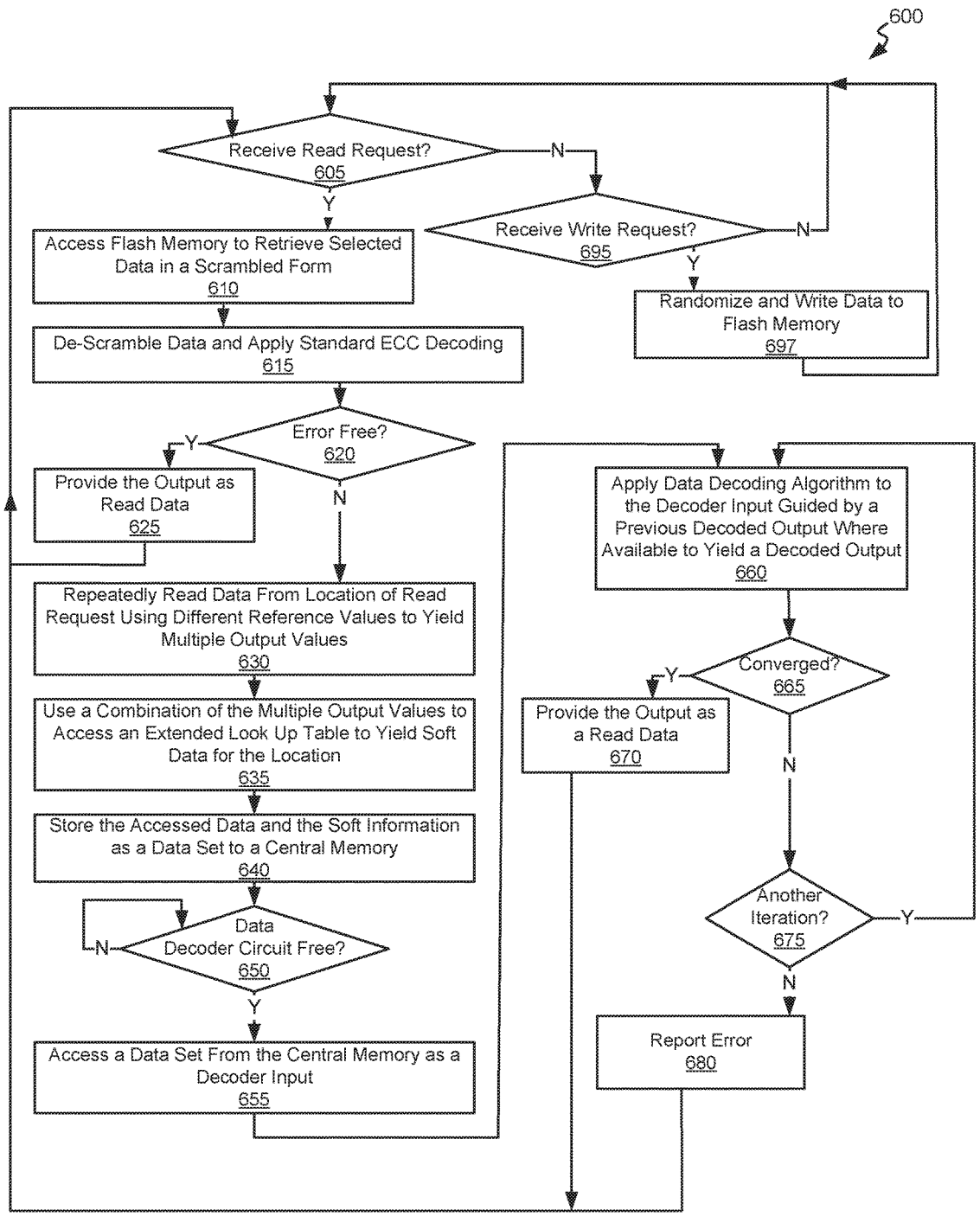
FIG. 6 is a flow diagram showing a method in accordance with some embodiments of the present invention for data processing using soft data generated using an extended look up table designed to account for read/write randomization.

Turning to FIG. 6, a flow diagram 600 shows a method in accordance with some embodiments of the present invention for data processing using soft data generated using an extended look up table designed to account for read/write randomization. Following flow diagram 600, it is determined whether a read request is received (block 605). Where a read request is not received (block 605), it is determined whether a write request has been received (block 695). Where a write request is received (block 695), data received is randomized, formatted and written to a location in the flash memory indicated by an address received as part of the write request (block 697), and the process returns to block 605.

Alternatively, when a read access is received (block 605), it includes an address indicating a location from which the data is to be accessed. Data is then accessed from the flash memory at the location indicated by the read request (block 610). As the data was randomized when it was written to the flash memory, the read data is in a scrambled form. The randomized read data is de-randomized by either an internal or external de-randomizing circuit, and standard error correction decoding is applied to correct one or more errors that exist in the data (block 615). It is determined whether the resulting data is error free (block 620). Where it is determined that the data is error free (block 620), the retrieved data is provided as read data (block 625). The process then returns to block 605.

Otherwise, where it is determined that the data is not error free (block 620), the cells of the flash memory corresponding to the failed data is repeatedly read using different reference values to yield multiple output values (block 630). Turning to FIG. 5, an example of this multi-read process is shown. Voltage diagram 500 shows the voltage distributions of a two bit memory cell with each of the voltage distributions representing a different state (i.e., erase, state P1, state P2, state P3). Using the example in the table above, the erase state P3 corresponds to an output value from a read circuit of '11', state P1 corresponds to an output value from the read circuit of '10', state P2 corresponds to an output value from the read circuit of '00', and state P3 corresponds to an output value from the read circuit of '01'.

Another voltage diagram 550 shows voltage diagram 500 where multiple threshold values (R1, R2, R3, R4, R5) are used to read the lower page (least significant bit) of the cell. In this case, assume the cell is programmed to be state P1 (01), then successively reading the cell while successively changing the reference voltage used by the read circuit from R1 to R5 the values read extend from '1' in a region A to a in region F as shown in the following table:

| R1 | R2 | R3 | R4 | R5 | Represented Region | Soft Data |
|----|----|----|----|----|--------------------|-----------|
| 1  | 1  | 1  | 1  | 1  | A                  | LLR_A (7) |
| 0  | 1  | 1  | 1  | 1  | B                  | LLR_B (4) |
| 0  | 0  | 1  | 1  | 1  | C                  | LLR_C (2) |
| 0  | 0  | 0  | 1  | 1  | D                  | LLR_D (-1)|
| 0  | 0  | 0  | 0  | 1  | E                  | LLR_E (-3)|
| 0  | 0  | 0  | 0  | 0  | F                  | LLR_F (-6)|

The soft data values (LLR_A, LLR_B, LLR_C, LLR_D, LLR_E, and LLR_F) are used to map the results of the series of reads to soft data.

The aforementioned table assumes that the data written to the location is actually state P1 data. This may not be the case as a randomizer circuit may have inverted the data. In such a case, the data may be one of the other states. Where the least significant bit was inverted (i.e., from a '1' in the expected state P1 to a in the inverted state), the following reversed table would result from the multiple read:

| R1 | R2 | R3 | R4 | R5 | Represented Region | Soft Data |
|----|----|----|----|----|--------------------|-----------|
| 0  | 0  | 0  | 0  | 0  | A                  | ??        |
| 1  | 0  | 0  | 0  | 0  | B                  | ??        |
| 1  | 1  | 0  | 0  | 0  | C                  | ??        |
| 1  | 1  | 1  | 0  | 0  | D                  | ??        |
| 1  | 1  | 1  | 1  | 0  | E                  | ??        |
| 1  | 1  | 1  | 1  | 1  | F                  | ??        |

The reversal of the table requires a different approach to assigning soft data values. Of note, where it is not known whether an inversion was applied by a randomizer circuit, the results from reading region A and region F are ambiguous. However, the results from reading region B, region C, region D and region E can be discerned between the inverted and non-inverted condition. Using the lack of ambiguity as to the center regions (i.e., region B, region C, region D and region E) and the known increment from R1 to R5, the ambiguity of region A and region B can be resolved allowing for the assignment of soft data to each of the results possible in an inverted situation. These results are used to extend the table of soft data as follows:

| R1 | R2 | R3 | R4 | R5 | Represented Region | Soft Data |
|----|----|----|----|----|--------------------|-----------|
| 1  | 1  | 1  | 1  | 1  | A                  | LLR_A (7) |
| 0  | 1  | 1  | 1  | 1  | B                  | LLR_B (4) |
| 0  | 0  | 1  | 1  | 1  | C                  | LLR_C (2) |
| 0  | 0  | 0  | 1  | 1  | D                  | LLR_D (-1)|
| 0  | 0  | 0  | 0  | 1  | E                  | LLR_E (-3)|
| 0  | 0  | 0  | 0  | 0  | F                  | LLR_F (-6)|
| 1  | 0  | 0  | 0  | 0  | B                  | LLR_B (-4)|
| 1  | 1  | 0  | 0  | 0  | C                  | LLR_C (-2)|
| 1  | 1  | 1  | 0  | 0  | D                  | LLR_D (1) |
| 1  | 1  | 1  | 1  | 0  | E                  | LLR_E (3) |

Of note, the magnitude for the soft data for corresponding regions is maintained because they originate from the same state (e.g., LLR_B(4) and LLR_B(-4)). However, the sign of the soft data is flipped (e.g., LLR_B(4) and LLR_B(-4)) because the soft data as the soft data is provided to a data processing circuit that occurs after the de-randomizer circuit has reversed the prior bit inversion. This extended table is maintained as a map in a scramble compensating extended look up table.

Another voltage diagram 580 shows voltage diagram 500 where multiple threshold values (R1, R2, R3, R4, R5) are used to read the upper page (most significant bit) of the cell. In this case, assume the cell is programmed to be state P3 ('10'), then successively reading the cell while successively changing the reference voltage used by the read circuit from R1 to R5 the values read extend from '1' in a region A to a in region F as shown in the following table:

| R1 | R2 | R3 | R4 | R5 | Represented Region | Soft Data |
|----|----|----|----|----|--------------------|-----------|
| 1  | 1  | 1  | 1  | 1  | A                  | LLR_A (7) |
| 0  | 1  | 1  | 1  | 1  | B                  | LLR_B (4) |
| 0  | 0  | 1  | 1  | 1  | C                  | LLR_C (2) |
| 0  | 0  | 0  | 1  | 1  | D                  | LLR_D (-1)|
| 0  | 0  | 0  | 0  | 1  | E                  | LLR_E (-3)|
| 0  | 0  | 0  | 0  | 0  | F                  | LLR_F (-6)|
| 1  | 0  | 0  | 0  | 0  | G                  | LLR_G (-3)|
| 1  | 1  | 0  | 0  | 0  | H                  | LLR_H (-1)|
| 1  | 1  | 1  | 0  | 0  | I                  | LLR_I (1) |
| 1  | 1  | 1  | 1  | 0  | J                  | LLR_J (4) |

The soft data values (LLR_A, LLR_B, LLR_C, LLR_D, LLR_E, LLR_F, LLR_G, LLR_H, LLR_I and LLR_J) are used to map the results of the series of reads to soft data.

Referring again to FIG. 6, the multiple output values are used to access a scramble compensating extended look up table similar to that described above in relation to FIG. 5 (block 635). Accessing the scramble compensating extended look up table returns soft data values for each of the combinations of multiple output values. This soft data accessed from the scramble compensating extended look up table is stored to a central memory circuit (block 640). It is then determined whether a data decoder circuit is available for processing the soft data (block 650).

Where the data decoder circuit is available for processing (block 650), a previously stored soft data set is accessed from the central memory as a decoder input (block 655). A data decoding algorithm is applied to the accessed soft data set to yield a decoded output (block 660). Where available (i.e., for the second and later iterations), a previous decoded output is used to guide application of the data decoding algorithm. In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention.

It is determined whether the decoded output converged (block 665). Where it is determined that the decoded output converged (block 665), the decoded output is provided as read data (block 670) and the process returns to block 605. Alternatively, where it is determined that the decoded output failed to converge (block 665). It is determined whether another iteration of the data decoding algorithm is allowed (block 675). In some cases, a maximum number of iterations of the data decoding algorithm is fixed or programmable. This is effectively a timeout condition. In some cases, the maximum number of allowable iterations of the data decoding algorithm is one hundred. Based upon the disclosure provided herein, one of ordinary skill in the art will recognize other numbers of iterations that may be allowed in relation to different embodiments of the present invention. Where another local iteration is not allowed (block 675), an error is indicated (block 680), and the process returns to block 605. Otherwise, where another iteration of the decoding algorithm is allowed (block 675), the processes of blocks 660-675 are repeated.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data storage system, the system comprising:
a solid state memory device;
a soft data generation circuit operable to receive multiple instances of an element of a read data set accessed from the solid state memory device; and access a scramble compensating extended look up table using the multiple instances of the element to receive corresponding soft data, wherein the scramble compensating extended look up table includes modified soft data values and unmodified soft data values; and
a data decoder circuit operable to yield a decoded output from the soft data.

2. The data storage system of claim 1, wherein the data decoder circuit is operable to apply a soft decoding process to the soft data to yield the decoded output.

3. The data storage system of claim 2, wherein the soft decoding process is a low density parity check decoding process.

4. The data storage system of claim 1, wherein each instance of the element is read using a different reference value.

5. The data storage system of claim 1, wherein the scramble compensating extended look up table includes a number of soft data values corresponding to different possible values for the multiple instances of the element.

6. The data storage system of claim 1, wherein the solid state memory device comprises a single bit per cell flash memory.

7. The data storage system of claim 1, further comprising:
a data de-randomizer circuit operable to de-randomize the soft data, wherein the modified soft data values correspond to soft data modified by the de-randomizer circuit, and wherein the unmodified soft data values correspond to soft data unmodified by the de-randomizer circuit.

8. The data storage system of claim 7, wherein the soft data generation circuit, the data decoder circuit, and the data de-randomizer circuit are hardware circuits.

9. The data storage system of claim 7, wherein the solid state memory device comprises a multi-bit per cell flash memory, wherein the multiple instances of the element includes a first set of instances corresponding to a first bit in a cell of the multi-bit bit per cell flash memory, and a second set of instances of the element corresponds to a second bit in the cell of the multi-bit per cell flash memory.

10. The data storage system of claim 9, wherein the scramble compensating extended look up table includes a first set of soft data values corresponding to different possible values for the first set of instances, and a second set of soft data values corresponding to different possible values for the second set of instances.

11. The data storage system of claim 10, further comprising a data de-randomizer circuit operable to de-randomize the soft data, wherein a first portion of the first set of soft data values corresponds to data unmodified by the de-randomizer circuit, and a second portion of the first set of soft data values corresponds to data modified by the de-randomizer circuit.

12. The data storage system of claim 11, wherein all of the second portion of the first set of soft data values corresponds to data modified by the de-randomizer circuit.

13. The data storage system of claim 11, wherein all of the second portion of the first set of soft data values corresponds to data unmodified by the de-randomizer circuit.

14. A method for recovering data from a solid state memory device, the method comprising:
   accessing, via a soft data generation circuit, a cell of a solid state memory device to yield, in conjunction with a data decoder circuit, multiple instances of a read;
   accessing, via the soft data generation circuit, a scramble compensating extended look up table using the multiple instances to receive corresponding soft data, wherein the scramble compensating extended look up table includes modified soft data values and unmodified soft data values.

15. The method of claim 14, wherein accessing the cell includes repeatedly accessing the cell using different reference values.

16. The method of claim 14, further comprising:
   applying a de-randomizer process using a de-randomizer circuit to each of the multiple instances of the read to yield corresponding de-randomized instances, wherein the modified soft data values correspond to soft data modified by the de-randomizer circuit, and wherein the unmodified soft data values correspond to soft data unmodified by the de-randomizer circuit; and
   accessing the scramble compensating extended look up table using the de-randomized instances.

17. The method of claim 14, the method further comprising:
   applying a low density parity check decoding process to the soft data to yield a decoded output.

18. The method of claim 14, wherein the scramble compensating extended look up table includes a number of soft data values corresponding to different possible values for the multiple instances of the element.

19. A data storage system, the system comprising:
   a memory device;
   a soft data generation circuit operable to receive multiple instances of an element of a read data set accessed from the solid state memory device; and access a scramble compensating extended look up table using the multiple instances of the element to receive corresponding soft data, wherein the scramble compensating extended look up table includes modified soft data values and unmodified soft data values; and
   a data decoder circuit operable to yield a decoded output from the soft data, wherein the soft data generation circuit and the data decoder circuit are hardware circuits.

20. The data storage system of claim 19, wherein the data decoder circuit is operable to apply a soft decoding process to the soft data to yield the decoded output.

* * * * *